United States Patent
Byun

(10) Patent No.: US 8,164,963 B2
(45) Date of Patent: Apr. 24, 2012

(54) SEMICONDUCTOR MEMORY DEVICE

(75) Inventor: Hee-Jin Byun, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 298 days.

(21) Appl. No.: 12/647,951

(22) Filed: Dec. 28, 2009

(65) Prior Publication Data

US 2011/0128802 A1    Jun. 2, 2011

(30) Foreign Application Priority Data

Nov. 30, 2009   (KR) .................. 10-2009-0117427

(51) Int. Cl.
*G11C 8/00* (2006.01)

(52) U.S. Cl. .................. 365/193; 365/189.08; 365/194; 365/233.1

(58) Field of Classification Search .................. None
See application file for complete search history.

(56) References Cited

U.S. PATENT DOCUMENTS 7,800,957 B2 * 9/2010 Na .......................... 365/189.05

FOREIGN PATENT DOCUMENTS

| KR | 1020020053193 | 7/2002 |
|---|---|---|
| KR | 1020030002228 | 1/2003 |
| KR | 1020030039179 | 5/2003 |
| KR | 100673678 | 1/2007 |

OTHER PUBLICATIONS

Notice of Preliminary Rejection issued from Korean Intellectual Property Office on Mar. 18, 2011.
Notice of Allowance issued from Korean Intellectual Property Office on Nov. 30, 2011.

* cited by examiner

*Primary Examiner* — Tan T. Nguyen
(74) *Attorney, Agent, or Firm* — IP & T Group LLP

(57) ABSTRACT

A semiconductor memory device includes: a first strobe signal generation unit configured to generate a first rising strobe signal in response to a rising DLL clock signal; a second strobe signal generation unit configured to generate a second rising strobe signal in response to a falling DLL clock signal, the second rising strobe signal having an opposite phase to the first rising strobe signal and being activated at the same timing as the first rising strobe signal; a third strobe signal generation unit configured to generate a first falling strobe signal in response to the falling DLL clock signal; and a fourth strobe signal generation unit configured to generate a second falling strobe signal in response to the rising DLL clock signal, the second falling strobe signal having an opposite phase to the first falling strobe signal and being activated at the same timing as the first falling strobe signal.

8 Claims, 5 Drawing Sheets

SEMICONDUCTOR MEMORY DEVICE

CROSS-REFERENCE TO RELATED APPLICATIONS

The present application claims priority of Korean Patent Application No. 10-2009-0117427, filed on Nov. 30, 2009, which is incorporated herein by reference in its entirety.

BACKGROUND OF THE INVENTION

Exemplary embodiments of the present invention relate to a semiconductor design technology, and more particularly, to a semiconductor memory device including a data output strobe signal generation circuit.

Generally, semiconductor devices, specifically double data rate synchronous DRAMs (DDR SDRAMs), are configured to receive an external clock signal to generate an internal clock signal. A delay within a semiconductor device may cause a clock skew between an external clock signal and an internal clock signal. Therefore, a clock synchronization circuit for compensating for the clock skew is provided within the semiconductor device. Representative examples of the clock synchronization circuit are a phase locked loop (PLL) and a delay locked loop (DLL).

The internal clock signal generated in this manner is inputted to several circuits within the semiconductor device and used as a reference for the respective circuits.

Meanwhile, the semiconductor memory device includes a data output buffer for a data output operation. The data output buffer is configured to output data transferred through global input/output lines in synchronism with a data output strobe signal. The data output strobe signal is generated from a rising clock signal having a high duration at a rising edge time of a DLL clock signal, or a falling clock signal having a high duration at a falling edge time of a DLL clock signal. To this end, a data output strobe signal generation circuit is provided.

FIG. 1 is a block diagram of a typical data output circuit.

Referring to FIG. 1, the typical data output circuit includes a delay locked loop 110, a data output strobe signal generation unit 130, and a data output unit 150.

The delay locked loop 110 is configured to receive an external clock signal CLK_EXT to generate a rising DLL clock signal RCLK_DLL which is synchronized with a rising edge of the external clock signal CLK_EXT and is compensated for clock skew, and a falling DLL clock signal FCLK_DLL which is synchronized with a falling edge of the external clock signal CLK_EXT and is compensated for clock skew.

The data output strobe signal generation unit 130 is configured to receive the rising DLL clock signal RCLK_DLL and the falling DLL clock signal FCLK_DLL to generate data output strobe signals RCLK_DO, RCLK_DOB, FCLK_DO and FCLK_DOB.

The data output unit 150 is configured to receive data signals (not shown) and output a data signal as a final output data DATA in synchronism with the data output strobe signals.

FIG. 2 is a detailed block diagram of the data output strobe signal generation unit 130 illustrated in FIG. 1.

The data output strobe signal generation unit 130 receives a rising data enable signal ROUTEN and a falling data enable signal FOUTEN in order to generate the data output strobe signals RCLK_DO, RCLK_DOB, FCLK_DO and FCLK_DOB. The rising data enable signal ROUTEN is an enable signal which is activated from a logic low level to a logic high level so that data is outputted at a rising time of a clock, and the falling data enable signal FOUTEN is an enable signal which is activated from a logic low level to a logic high level at a falling time of a clock.

Referring to FIG. 2, the data output strobe signal generation unit 130 includes a first NAND gate 131, a first inverter 132, a second inverter 133, a second NAND gate 135, a third inverter 136, and a fourth inverter 137. The first NAND gate 131 is configured to receive a NAND operation on the rising DLL clock signal RCLK_DLL and the rising data enable signal ROUTEN and perform a NAND operation on the received signals RCLK_DLL and ROUTEN. The first inverter 132 is configured to receive an output signal of the first NAND gate 131, invert a phase of the output signal of the first NAND gate 131, and output the first rising strobe signal RCLK_DO.

The second inverter 133 is configured to receive an output signal of the first inverter 132, invert a phase of the output signal of the first inverter 132, and output the second rising strobe signal RCLK_DOB. The second NAND gate 135 is configured to receive the falling DLL clock signal FCLK_DLL and the falling data enable signal FOUTEN and perform a NAND operation on the received signals FCLK_DLL and FOUTEN. The third inverter 136 is configured to receive an output signal of the second NAND gate 135, invert a phase of the output signal of the second NAND gate 135, and output the first falling strobe signal FCLK_DO. The fourth inverter 137 is configured to receive an output signal of the third inverter 136, invert a phase of the output signal of the third inverter 136, and output the second falling strobe signal FCLK_DOB.

That is, the second rising strobe signal RCLK_DOB is generated by inverting the first rising strobe signal RCLK_DO, and the second falling strobe signal FCLK_DOB is generated by inverting the first falling strobe signal RCLK_DOB. Therefore, the second rising strobe signal RCLK_DOB is delayed by a delay amount corresponding to one inverter, relative to the first rising strobe signal RCLK_DO, and the second falling strobe signal FCLK_DOB is delayed by a delay amount corresponding to one inverter, relative to the first falling strobe signal FCLK_DO.

FIG. 3 is a detailed circuit diagram of the data output unit 150 illustrated in FIG. 1.

Referring to FIG. 3, the data output unit 150 is configured to output a first data signal RDO as a final output data DATA in response to the first rising strobe signal RCLK_DO and the second rising strobe signal RCLK_DOB, and output a second data signal FDO as the final output data DATA in response to the first falling strobe signal FCLK_DO and the second falling strobe signal FCLK_DOB. Accordingly, a final data DATA is outputted from the data output unit 150.

As illustrated in FIG. 4, the data output unit 150 receives the first rising strobe signal RCLK_DO and the second rising strobe signal RCLK_DOB having opposite phases to each other to output the first data signal RDO, and receives the first falling strobe signal FCLK_DO and the second falling strobe signal FCLK_DOB having opposite phases to each other to output the second data signal FDO.

In this case, the first data signal RDO and the second data signal FDO are alternately outputted. However, as illustrated in FIG. 4, since the rising time and the falling time of the respective strobe signals are different, Vox is large and a data valid window (tDV) is small. Vox (deviation of the output cross point voltage from the termination voltage) represents a voltage difference between a cross point voltage of the strobe signals used during data output and half the power supply voltage (VDD/2) used for driving the data output unit 150.

Thus, distorted data have been outputted. That is, it may be difficult to output data having a stable voltage level at a desired timing, causing degradation in the performance of the semiconductor device.

SUMMARY OF THE INVENTION

An embodiment of the present invention is directed to a semiconductor memory device including a data output strobe signal generation circuit, which ensures a data valid window (tDV) and improves Vox characteristics by activating two clock signals having opposite phases to each other at the same timing.

In accordance with an embodiment of the present invention, a semiconductor memory device includes a first strobe signal generation unit configured to generate a first rising strobe signal in response to a rising DLL clock signal, a second strobe signal generation unit configured to generate a second rising strobe signal in response to a falling DLL clock signal, the second rising strobe signal having an opposite phase to the first rising strobe signal and being activated at the same timing as the first rising strobe signal, a third strobe signal generation unit configured to generate a first falling strobe signal in response to the falling DLL clock signal, and a fourth strobe signal generation unit configured to generate a second falling strobe signal in response to the rising DLL clock signal, the second falling strobe signal having an opposite phase to the first falling strobe signal and being activated at the same timing as the first falling strobe signal.

DESCRIPTION OF SPECIFIC EMBODIMENTS

Figure 1:
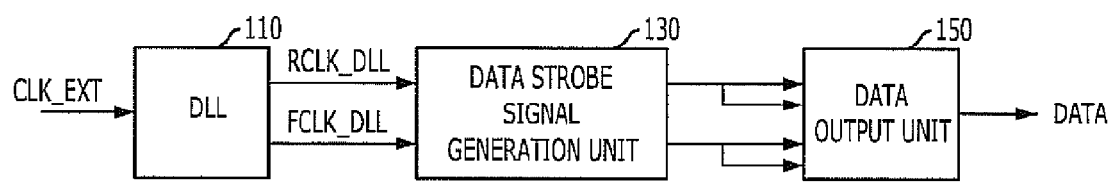
FIG. 1 is a block diagram of a typical data output circuit.
Figure 2:
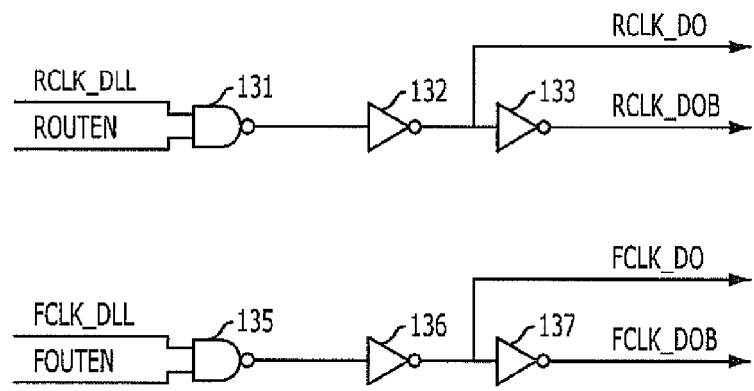
FIG. 2 is a detailed block diagram of a data output strobe signal generation unit illustrated in FIG. 1.
Figure 3:
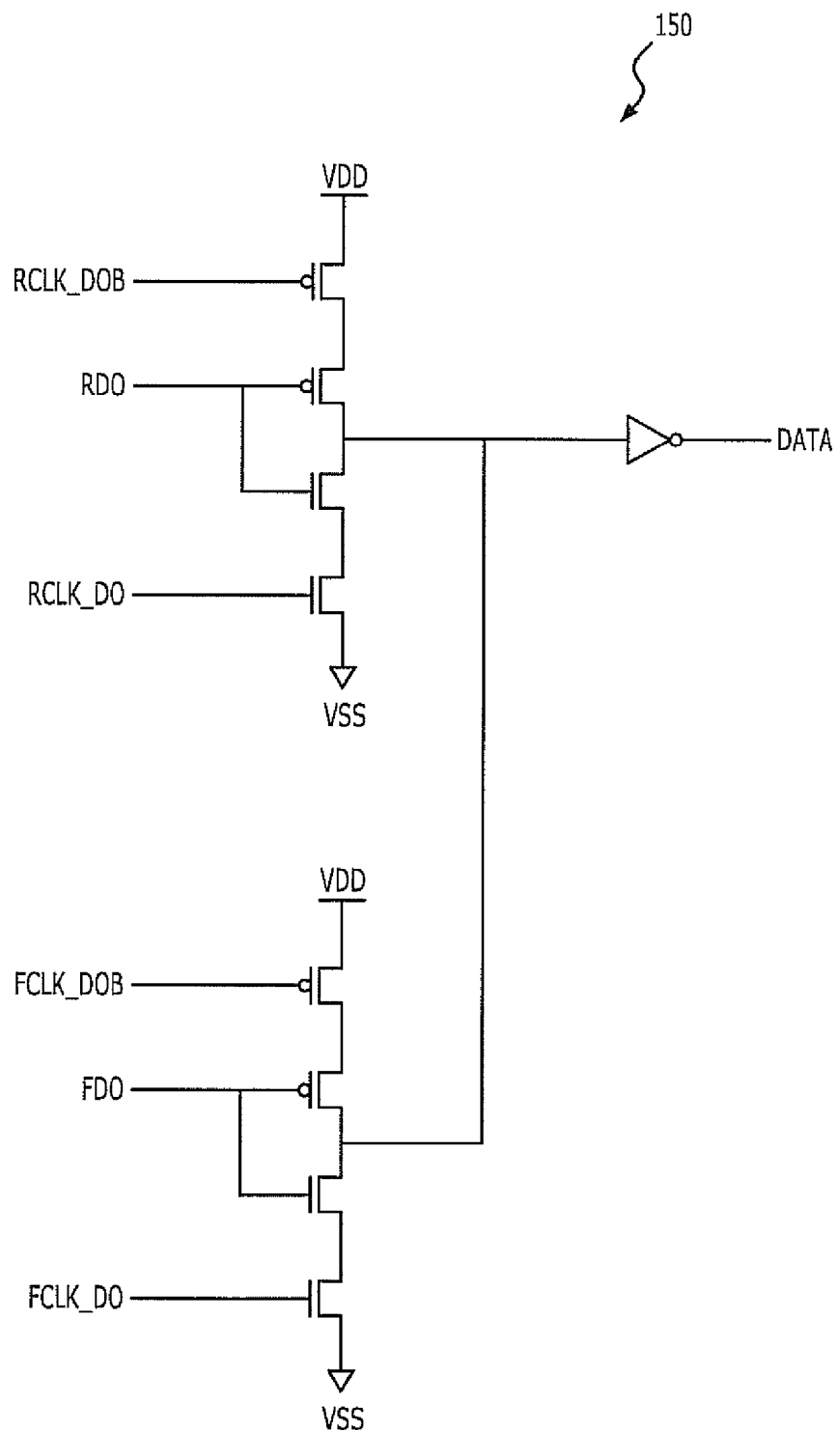
FIG. 3 is a detailed circuit diagram of a data output unit illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
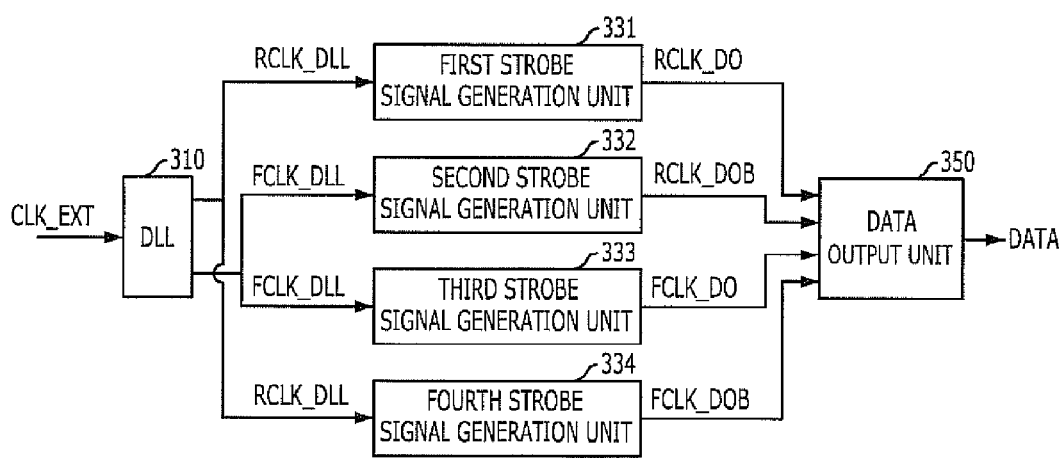
FIG. 5 is a block diagram of a semiconductor memory device in accordance with an embodiment of the present invention.

FIG. 5 is a block diagram of a semiconductor memory device in accordance with an embodiment of the present invention.

Referring to FIG. 5, the semiconductor memory device in accordance with the embodiment of the present invention includes a delay locked loop 310, a first strobe signal genera-tion unit 331, a second strobe signal generation unit 332, a third strobe signal generation unit 333, a fourth strobe signal generation unit 334, and a data output unit 350.

The delay locked loop 310 is configured to receive an external clock signal CLK_EXT to generate a rising DLL clock signal RCLK_DLL which is synchronized with a rising edge of the external clock signal CLK_EXT and is compensated for clock skew, and a falling DLL clock signal FCLK_DLL which is synchronized with a falling edge of the external clock signal CLK_EXT and is compensated for clock skew. The rising DLL clock signal RCLK_DLL and the falling DLL clock signal FCLK_DLL outputted from the delay locked loop 310 are signals having a duty cycle ratio of 50%. Since there is considerable research on the delay locked loop 310 which outputs a signal having a duty cycle ratio of 50%, a detailed description thereof has been omitted for the sake of brevity.

The first strobe signal generation unit 331 is configured to receive the rising DLL clock signal RCLK_DLL and to generate a first rising strobe signal RCLK_DO.

The second strobe signal generation unit 332 is configured to receive the falling DLL clock signal FCLK_DLL and to generate a second rising strobe signal RCLK_DOB which has an opposite phase to the first rising strobe signal RCLK_DO and is activated at the same timing as the first rising strobe signal RCLK_DO.

The third strobe signal generation unit 333 is configured to receive the falling DLL clock signal FCLK_DLL and to generate a first falling strobe signal FCLK_DO.

The fourth strobe signal generation unit 334 is configured to receive the rising DLL clock signal RCLK_DLL and to generate a second falling strobe signal FCLK_DOB which has an opposite phase to the first falling strobe signal FCLK_DO and is activated at the same timing as the first falling strobe signal FCLK_DOB.

That is, the first to fourth strobe signal generation units 331 to 334 receive the rising DLL clock signal RCLK_DLL and the falling DLL clock signal FCLK_DLL to individually generate the two strobe signals RCLK_DO and RCLK_DOB, which are activated at the same timing and have opposite phases to each other, and the two strobe signals FCLK_DO and FCLK_DOB, which are activated at the same timing and have opposite phases to each other, with respect to the rising DLL clock signal RCLK_DLL and the falling DLL clock signal FCLK_DLL.

The data output unit 350 is configured to receive data signals (not shown) and output a data signal as a final output data DATA in synchronism with the data output strobe signals.

Figure 6:
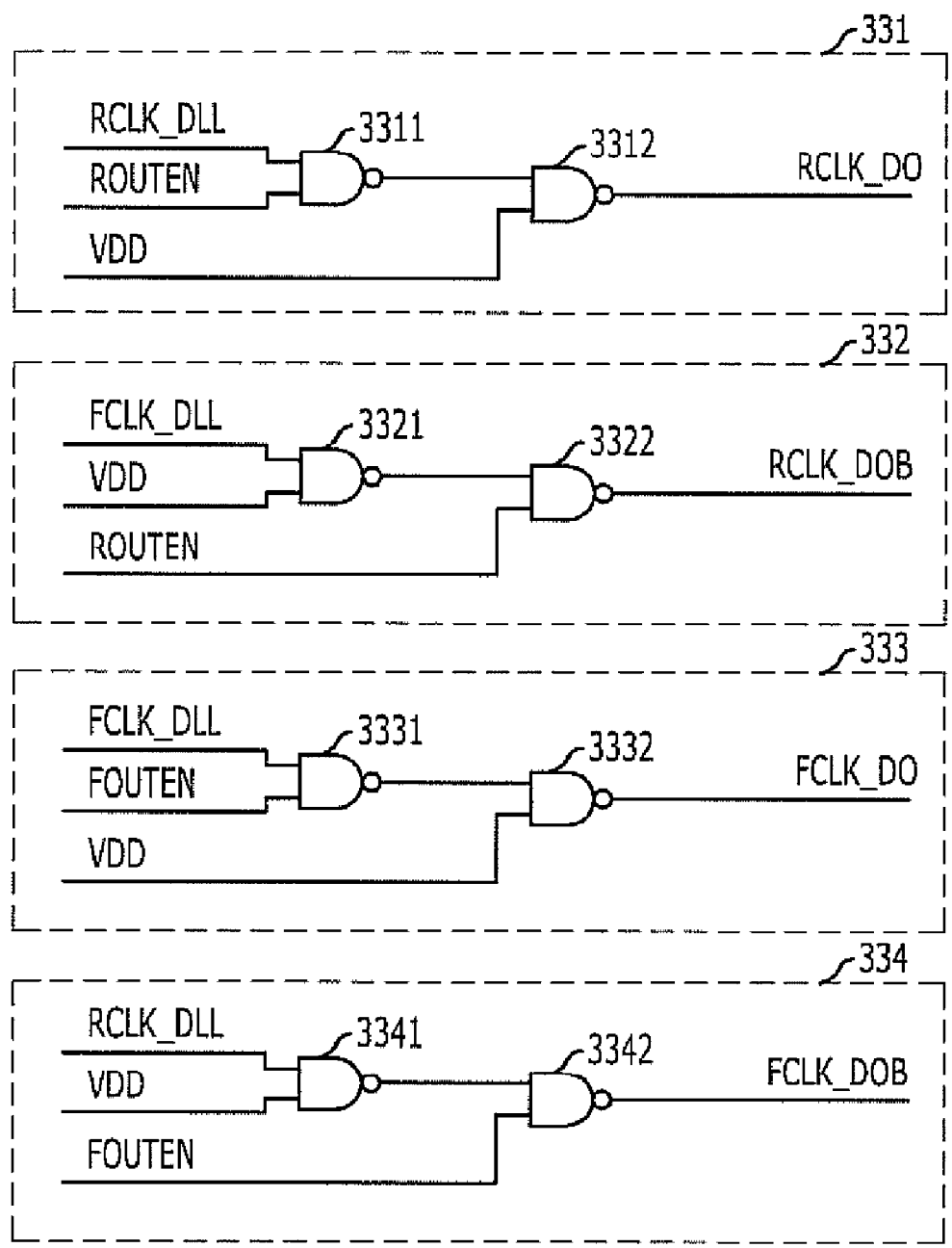
FIG. 6 is a detailed block diagram of first to fourth strobe signal generation units illustrated in FIG. 5.

FIG. 6 is a detailed block diagram of the first to fourth strobe signal generation units 331 to 334 illustrated in FIG. 5.

The first to fourth strobe signal generation units 331 to 334 also receive a rising data enable signal ROUTEN and a falling data enable signal FOUTEN in order to generate the strobe signals RCLK_DO, RCLK_DOB, FCLK_DO and FCLK_DOB. The rising data enable signal ROUTEN is an enable signal which is activated from a logic low level to a logic high level so that data is outputted at a rising time of a clock, and the falling data enable signal FOUTEN is an enable signal which is activated from a logic low level to a logic high level at a falling time of a clock.

Referring to FIG. 6, the first strobe signal generation unit 331 includes a first NAND gate 3311 and a second NAND gate 3312. The first NAND gate 3311 is configured to receive the rising DLL clock signal RCLK_DLL and the rising data enable signal ROUTEN and to perform a NAND operation on the received signals RCLK_DLL and ROUTEN. The second NAND gate 3312 is configured to receive an output signal of the first NAND gate 3311 and a power supply voltage signal VDD and to perform a NAND operation on the received signals to output the first rising strobe signal RCLK_DO.

The second strobe signal generation unit 332 includes a third NAND gate 3321 and a fourth NAND gate 3322. The third NAND gate 3321 is configured to receive the falling DLL clock signal FCLK_DLL and the power supply voltage signal VDD and to perform a NAND operation on the received signals FCLK_DLL and VDD. The fourth NAND gate 3322 is configured to receive an output signal of the third NAND gate 3321 and the rising data enable signal ROUTEN and to perform a NAND operation on the received signals to output the second rising strobe signal RCLK_DOB.

The third strobe signal generation unit 333 includes a fifth NAND gate 3331 and a sixth NAND gate 3332. The fifth NAND gate 3331 is configured to receive the falling DLL clock signal FCLK_DLL and the falling data enable signal FOUTEN and to perform a NAND operation on the received signals FCLK_DLL and FOUTEN. The sixth NAND gate 3332 is configured to receive an output signal of the fifth NAND gate 3331 and the power supply voltage signal VDD and to perform a NAND operation on the received signals to output the first falling strobe signal FCLK_DO.

The fourth strobe signal generation unit 334 includes a seventh NAND gate 3341 and an eighth NAND gate 3342. The seventh NAND gate 3341 is configured to receive the rising DLL clock signal RCLK_DLL and the power supply voltage signal VDD and to perform a NAND operation on the received signals RCLK_DLL and VDD. The eighth NAND gate 3342 is configured to receive an output signal of the seventh NAND gate 3341 and the falling data enable signal FOUTEN and to perform a NAND operation on the received signals to output the second falling strobe signal FCLK_DOB.

The process of generating the respective strobe signals is described below in detail.

The first rising strobe signal RCLK_DO is generated by performing the NAND operation on the rising DLL clock signal RCLK_DLL and the rising data enable signal ROUTEN at the first NAND gate 3311 and performing the NAND operation on the output signal of the first NAND gate 3311 and the power supply voltage signal VDD at the second NAND gate 3312.

The second rising strobe signal RCLK_DOB is generated by performing the NAND operation on the falling DLL clock signal FCLK_DLL and the power supply voltage signal VDD at the third NAND gate 3321 and performing the NAND operation on the output signal of the third NAND gate 3321 and the rising data enable signal ROUTEN at the fourth NAND gate 3322.

The first falling strobe signal FCLK_DO is generated by performing the NAND operation on the falling DLL clock signal FCLK_DLL and the falling data enable signal FOUTEN at the fifth NAND gate 3331 and performing the NAND operation on the output signal of the fifth NAND gate 3331 and the power supply voltage signal VDD at the sixth NAND gate 3332.

The second falling strobe signal FCLK_DOB is generated by performing the NAND operation on the rising DLL clock signal RCLK_DLL and the power supply voltage signal VDD at the seventh NAND gate 3341 and performing the NAND operation on the output signal of the seventh NAND gate 3341 and the falling data enable signal FOUTEN.

Since both the first rising strobe signal RCLK_DO and the second rising strobe signal RCLK_DOB are individually generated through two NAND gates, the first rising strobe signal RCLK_DO and the second rising strobe signal RCLK_DOB are activated at the same timing.

In addition, since both the first falling strobe signal FCLK_DO and the second falling strobe signal FCLK_DOB are individually generated through two NAND gates, the first falling strobe signal FCLK_DO and the second falling strobe signal FCLK_DOB are activated at the same timing.

Meanwhile, the second rising strobe signal RCLK_DOB is generated using the falling DLL clock signal FCLK_DLL, and the second falling strobe signal FCLK_DOB is generated using the rising DLL clock signal RCLK_DLL.

Figure 7:
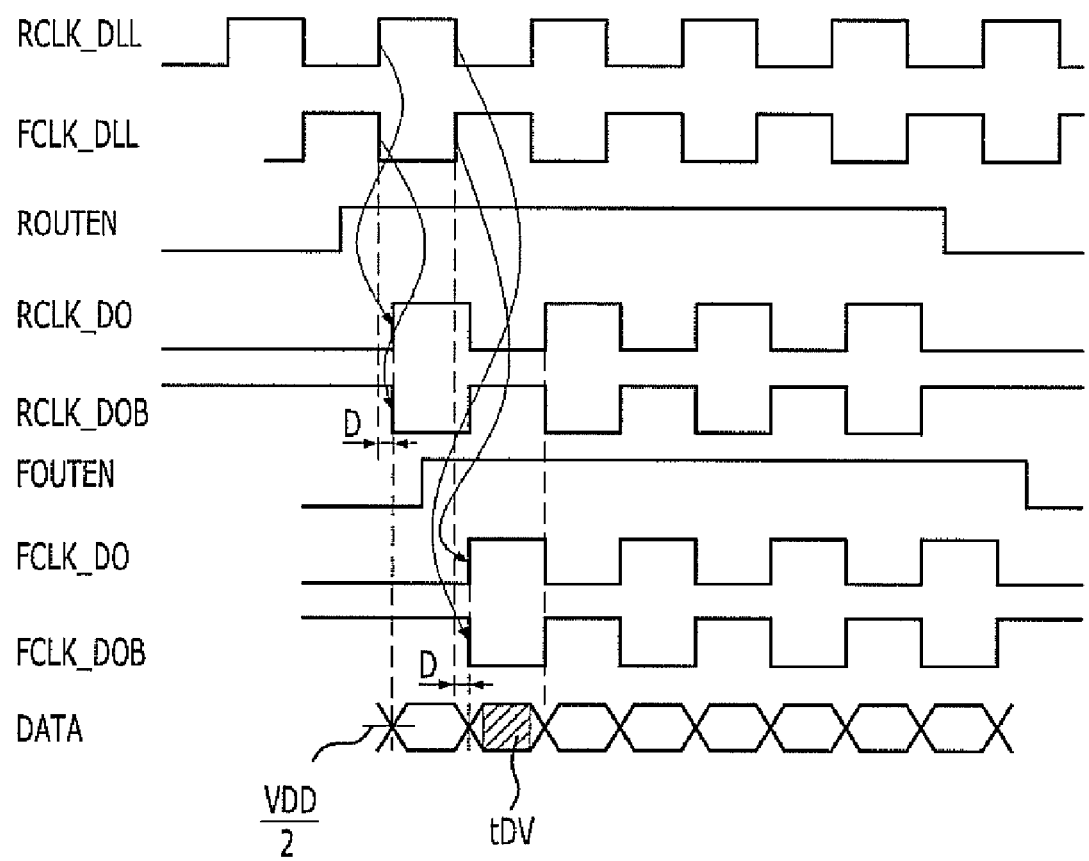
FIG. 7 is a timing diagram illustrating the operation of the semiconductor memory device of FIG. 5 in accordance with the embodiment of the present invention.

FIG. 7 is a timing diagram illustrating the operation of the semiconductor memory device of FIG. 5 in accordance with the embodiment of the present invention.

Referring to FIG. 7, after the rising data enable signal ROUTEN is activated from a logic low level to a logic high level, the first rising strobe signal RCLK_DO is generated in response to the rising DLL clock signal RCLK_DLL. In this case, the first rising strobe signal RCLK_DO is a signal delayed by a time D taken to pass through the two NAND gates, relative to the rising DLL clock signal RCLK_DLL, and activated from a logic low level to a logic high level.

Meanwhile, after the rising data enable signal ROUTEN is activated from a logic low level to a logic high level, the second rising strobe signal RCLK_DOB is generated in response to the falling DLL clock signal FCLK_DLL. In this case, the second rising strobe signal RCLK_DOB is a signal delayed by the time D taken to pass through the two NAND gates, relative to the falling DLL clock signal FCLK_DLL, and activated from a logic high level to a logic low level at the same timing as the first rising strobe signal RCLK_DO. That is, the rising timing of the first rising strobe signal RCLK_DO coincides with the falling timing of the second rising strobe signal RCLK_DOB.

Meanwhile, after the falling data enable signal FOUTEN is activated from a logic low level to a logic high level, the first falling strobe signal FCLK_DO is generated in response to the falling DLL clock signal FCLK_DLL. In this case, the first falling strobe signal FCLK_DO is a signal delayed by the time D taken to pass through the two NAND gates, relative to the falling DLL clock signal FCLK_DLL, and activated from a logic low level to a logic high level.

Meanwhile, after the falling data enable signal FOUTEN is activated from a logic low level to a logic high level, the second falling strobe signal FCLK_DOB is generated in response to the rising DLL clock signal RCLK_DLL. In this case, the second falling strobe signal FCLK_DOB is a signal delayed by the time D taken to pass through the two NAND gates, relative to the rising DLL clock signal RCLK_DLL, and activated from a logic high level to a logic low level at the same timing as the first falling strobe signal FCLK_DO. That is, the rising timing of the first falling strobe signal FCLK_DO coincides with the falling timing of the second falling strobe signal FCLK_DOB.

Therefore, the first rising strobe signal RCLK_DO and the second rising strobe signal RCLK_DOB activated at the same time, and the first falling strobe signal FCLK_DO and the second falling strobe signal FCLK_DOB activated at the same timing are outputted.

The data output unit 350 outputs a first data signal RDO in response to the first rising strobe signal RCLK_DO and the second rising strobe signal RCLK_DOB, and outputs a third data signal FDO in response to the first falling strobe signal FCLK_DO and the second falling strobe signal FCLK_DOB. Accordingly, a final data DATA is outputted from the data output unit 350.

Figure 4:
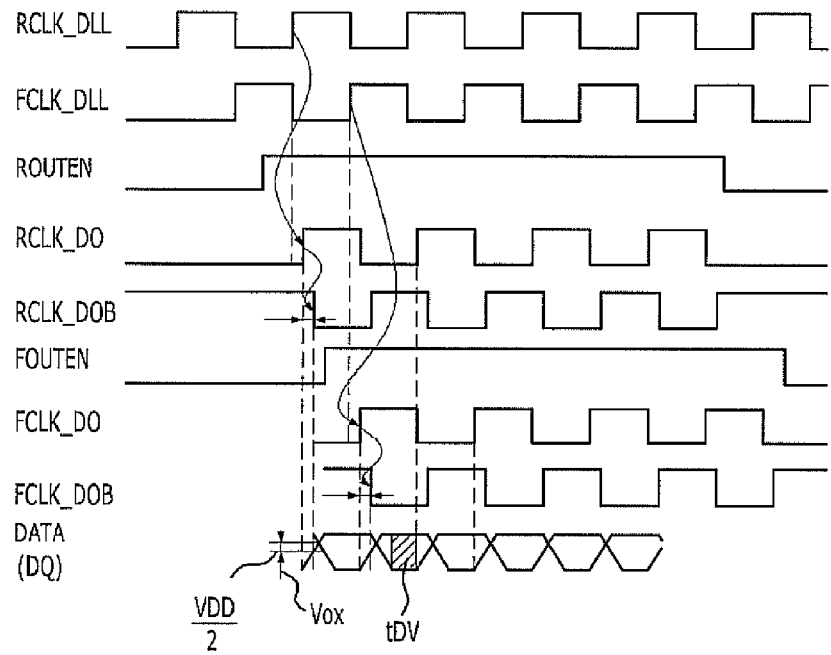
FIG. 4 is a timing diagram illustrating the operation of the semiconductor memory device of FIG. 1.

The rising time and the falling time of the respective strobe signals outputted in accordance with the embodiment of the present invention coincide with each other. Thus, compared with the final data output signal of FIG. 4, Vox of the final data output signal is very small and the data valid window (tDV) is sufficiently ensured. Vox (deviation of the output cross point voltage from the termination voltage) represents a voltage difference between a cross point voltage of the strobe signals used during data output and half the power supply voltage (VDD/2) used for driving the data output unit 350. That is, as illustrated in FIG. 7, since data is outputted without distortion, data having a stable voltage level is outputted at a desired timing.

In accordance with the exemplary embodiments of the present invention, the skew between the clock signals is removed by individually generating the clock signals used for the final data output so that the clock signals are activated at the same timing. Therefore, the data valid window (tDV) of the outputted data is sufficiently ensured and Vox characteristic is improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a first strobe signal generation unit configured to generate a first rising strobe signal in response to a rising DLL clock signal;
    a second strobe signal generation unit configured to generate a second rising strobe signal in response to a falling DLL clock signal, the second rising strobe signal having an opposite phase to the first rising strobe signal and being activated at the same timing as the first rising strobe signal;
    a third strobe signal generation unit configured to generate a first falling strobe signal in response to the falling DLL clock signal; and
    a fourth strobe signal generation unit configured to generate a second falling strobe signal in response to the rising DLL clock signal, the second falling strobe signal having an opposite phase to the first falling strobe signal and being activated at the same timing as the first falling strobe signal.

2. The semiconductor memory device of claim 1, wherein the strobe signal generation units generate respective strobe signals in response to the rising DLL clock signal and the falling DLL clock signal each having a duty cycle ratio of 50%.

3. The semiconductor memory device of claim 2, wherein the first strobe signal generation unit comprises:
    a first NAND gate configured to receive the rising DLL clock signal and a rising data enable signal and to perform a NAND operation thereon; and
    a second NAND gate configured to receive an output signal of the first NAND gate and a power supply voltage signal and to perform a NAND operation thereon to generate the first rising strobe signal.

4. The semiconductor memory device of claim 2, wherein the second strobe signal generation unit comprises:
    a first NAND gate configured to receive the falling DLL clock signal and a power supply voltage signal and to perform a NAND operation thereon; and
    a second NAND gate configured to receive an output signal of the first NAND gate and a rising data enable signal and to perform a NAND operation thereon to generate the second rising strobe signal.

5. The semiconductor memory device of claim 2, wherein the third strobe signal generation unit comprises:
    a first NAND gate configured to receive the falling DLL clock signal and a falling data enable signal and to perform a NAND operation thereon; and
    a second NAND gate configured to receive an output signal of the first NAND gate and a power supply voltage signal and to perform a NAND operation thereon to generate the first falling strobe signal.

6. The semiconductor memory device of claim 2, wherein the fourth strobe signal generation unit comprises:
    a first NAND gate configured to receive the rising DLL clock signal and a power supply voltage and to perform a NAND operation thereon; and
    a second NAND gate configured to receive an output signal of the first NAND gate and a falling data enable signal and to perform a NAND operation thereon to generate the second falling strobe signal.

7. The semiconductor memory device of claim 1, further comprising a delay locked loop configured to generate the rising DLL clock signal and the falling DLL clock signal having opposite phases to each other.

8. The semiconductor memory device of claim 1, further comprising a data output unit configured to output data in response to the first rising strobe signal, the second rising strobe signal, the first falling strobe signal, and the second falling strobe signal, which are respectively outputted from the first to fourth strobe signal generation units.

* * * * *